United States Patent
Beer (10) Patent No.: US 7,929,362 B2
(45) Date of Patent: Apr. 19, 2011

(54) INTEGRATED SEMICONDUCTOR MEMORY WITH DISTRIBUTOR LINE FOR REDUNDANT DATA LINES

(75) Inventor: Peter Beer, Weilheim (DE)

(73) Assignee: Qimonda AG, Munich (DE)

( * ) Notice: Subject to any disclaimer, the term of this patent is extended or adjusted under 35 U.S.C. 154(b) by 274 days.

(21) Appl. No.: 11/828,289

(22) Filed: Jul. 25, 2007

(65) Prior Publication Data

US 2008/0049525 A1 Feb. 28, 2008

(30) Foreign Application Priority Data

Jul. 28, 2006 (DE) .......................... 10 2006 035 076

(51) Int. Cl.
*G11C 29/00* (2006.01)
(52) U.S. Cl. .............. 365/200; 365/185.09; 365/230.03; 365/189.02
(58) Field of Classification Search ................... 365/200, 365/185.09, 185.11, 230.03, 189.02, 230.02

See application file for complete search history.

(56) References Cited

U.S. PATENT DOCUMENTS

| 4,729,117 | A | 3/1988 | Osaka |
| 5,227,999 | A | 7/1993 | Ihara et al. |
| 7,251,173 | B2 * | 7/2007 | Lunde et al. .................. 365/200 |
| 2002/0021600 | A1 * | 2/2002 | Tsuji ............................. 365/200 |
| 2003/0028710 | A1 * | 2/2003 | Shinohara et al. ............ 711/104 |
| 2005/0232035 | A1 | 10/2005 | Miyakawa et al. |
| 2006/0158924 | A1 * | 7/2006 | Sekiguchi et al. ............ 365/149 |

* cited by examiner

*Primary Examiner* — Tuan T Nguyen
*Assistant Examiner* — R Lance Reidlinger
(74) *Attorney, Agent, or Firm* — John S. Economou (57) ABSTRACT

In an embodiment, an integrated semiconductor memory includes a plurality of data lines via which data read out or to be read out from memory cells can be communicated, wherein the data lines comprise redundant data lines and non-redundant data lines, wherein the semiconductor memory has at least one data distributor line, and wherein a plurality of redundant data lines are connected up to the at least one data distributor line in such a way that in each case a redundant data line or a group of redundant data lines from the plurality of redundant data lines can be selected and can be connected to the at least one data distributor line.

29 Claims, 4 Drawing Sheets

*(PRIOR ART)*

INTEGRATED SEMICONDUCTOR MEMORY WITH DISTRIBUTOR LINE FOR REDUNDANT DATA LINES

This application claims priority to German Patent Application 10 2006 035 076.6, which was filed Jul. 28, 2006, and is incorporated herein by reference.

TECHNICAL FIELD

An embodiment of the invention relates to an integrated semiconductor memory and a method for operating an integrated semiconductor memory.

BACKGROUND

Integrated semiconductor memories have a plurality of data lines through which data are read out from memory cells or are written to the memory cells. With the aid of the data lines it is therefore possible to communicate data, that is to say a plurality of digital bits, between the memory cells and external terminals of the semiconductor memory. On these data paths provision may furthermore be made for signal amplifiers, for example, sense amplifiers, by means of which the electrical potentials of two mutually complementary bit lines are spread, or downstream secondary signal amplifiers which, as output amplifiers, once again amplify the communicated signals before the latter reach the output terminals of the semiconductor memory. The data lines can be provided, in particular, within the path section between the sense amplifiers and the output amplifiers.

An integrated semiconductor memory can be, for example, a volatile semiconductor memory, for instance a DRAM (dynamic random access memory) or a nonvolatile semiconductor memory. The data are stored in memory cells connected to first and to second lines, which are usually referred to as word lines and bit lines. In the case of a DRAM, the memory cell can comprise, for example, a selection transistor and a storage capacitor, wherein the selection transistor may be formed as a MOSFET (metal oxide semiconductor field effect transistor), the gate electrode of which is part of a word line and the first source/drain region of which is connected to a bit line.

The functioning of a semiconductor memory presupposes a proper electrical contact between the relevant conductive structures. Due to the dictates of production, however, deviations always occur with regard to the relative position of the conductive and also insulating structures with respect to one another, the deviations having disadvantageous effects on the electrical properties, to be precise also on the switching properties within the semiconductor memory.

Thus, between structures to be deposited one on top of another, in particular lateral offsets in the lateral direction, i.e., parallel to the substrate surface, can lead to relatively high-impedance electrical connections or even connection interruptions between the structures. As a result of lithographic misalignments (overlay misalignment), in particular, a lateral offset often arises between structures deposited one on top of another. One example of such lateral misalignments is the contact hole fillings (vias) which are often required in the case of segmented word lines and that are intended to produce an electrical connection having the lowest possible impedance between the main word line and the respective word line segment, but themselves have only a small basic area. A slight lateral deviation of their position therefore leads rapidly to high-impedance or even interrupted and therefore unusable word lines. Comparable problems occur also in the case of bit lines, other lines, or in the case of other conductive structures.

Integrated semiconductor memories therefore have redundant memory areas, which can be activated as an alternative if, in the course of testing the semiconductor memory prior to its delivery, it is ascertained that individual memory areas which are automatically addressed during normal operation are defective. By way of example, individual word lines or bit lines may be prone to floating and therefore uncontrollable electrical potentials since their electrical connection is deficient or entirely interrupted. Problems can therefore occur when reading out from memory cells which are connected to the rest of the word lines or bit lines These problems are only avoidable if the corresponding word line or bit line is permanently deactivated and is replaced by a redundant word line or bit line. In this case, during later operation, the address of the respective word line or bit line will generally be unchanged, but it is ensured by permanent settings within the semiconductor memory, for example, with the aid of fuses or antifuses, that the signals intended for the associated address are rerouted to a memory area that is permanently activated as an alternative (for instance to a redundant word line or bit line).

Semiconductor memories therefore have memory areas which are formed as an alternative and are permanently activated instead of remaining as defective memory areas only after fixed programming. These redundant memory areas are usually integrated overall into the memory cell array. They require additional substrate area on the semiconductor substrate, but reduce the reject rate of the semiconductor chips during fabrication because the redundant memory areas can be used as an alternative in the event of defective memory areas having been identified.

A memory cell array is usually subdivided into a plurality of subunits. One possible subdivision mentioned here by way of example is the separation of a memory cell array or of a subsection thereof into a plurality of "memory segments", wherein a memory segment can be understood to be, in particular, that memory area whose read-out data are all conducted to the same output amplifier. In the case of a DRAM, for example, the memory segment comprises those bit lines and those word line sections at which are arranged the memory cells whose data are communicated to, in each case the same output amplifier during read-out, via the sense amplifiers and data lines disposed downstream of the sense amplifiers. The word lines can also extend beyond a memory segment, such that only individual segments or partial areas of the word lines are assigned to the respective memory segment and thus to the respective output amplifier or secondary signal amplifier.

A memory cell array therefore contains memory segments defined by word line sections and bit lines (or if appropriate only by sections of bit lines). Such a memory segment is driven by a predetermined address range of memory addresses, for example, by a specific address space of the word line addresses and the bit line addresses. If a partial area of the respective memory segment is defective, it must be replaced by a redundant partial area.

Redundant memory areas are usually arranged between memory segments that are adjacent to one another. By way of example, it is possible to provide redundant memory cells which can be driven by redundant bit lines which can be read and/or written to by redundant sense amplifiers and redundant data lines disposed downstream of the sense amplifiers. The redundant memory cells can be connected to the same word lines as the rest of the memory cells of the respectively adjacent memory segments. Conversely, the memory cells can also be connected to redundant word lines but the same bit lines as adjacent memory segments, or be connected both to redundant word lines and to redundant bit lines.

Redundant data lines are used for reading out from redundant memory cells. In the case of a DRAM, the redundant data lines will be connected to the (redundant) sense amplifiers in the same way as the remaining, non-redundant data lines are connected to the regular, non-redundant sense amplifiers. In other types and designs of semiconductor memories, redundant memory areas including the redundant data lines are often arranged between the memory segments. The data contents of the memory segments are read out by means of regular, non-redundant data lines.

Additional substrate area is required for each redundant data line and the memory cells assigned thereto. Therefore, on the one hand endeavors are made to keep the number of redundant data lines and other redundant structures of the memory cell array as small as possible. On the other hand, the proportion of defective semiconductor chips which are still repairable by exchanging non-redundant structures for redundant structures is all the greater, the more redundant structures (for example, data lines) there are in the semiconductor memory.

One possible integration scheme would be to provide, between in each case two memory segments each containing a predetermined number of non-redundant data lines, in each case one or a plurality of redundant data lines which are assigned in each case to one of the adjacent memory segments. In this way, in the respectively adjacent memory segments, a data line could be replaced by the respective redundant data line. Thus, one or two redundant data lines running laterally alongside the regular data lines of the relevant memory segment can additionally be provided, for example, for each memory segment.

All semiconductor chips in which per memory segment one or two data lines (or a number of data lines corresponding to the number of redundant data lines per memory segment) are connected to defective memory areas would be repairable in this way. However, as soon as the number of non-redundant data lines which are assigned to defective or partly defective memory areas in at least one memory segment is greater than the number of redundant data lines per memory segment, such that a semiconductor chip can no longer be operated properly and has to be rejected.

SUMMARY OF THE INVENTION

An embodiment of the present invention is to provide an integrated semiconductor memory and an operating method with which redundant data lines and memory areas assigned thereto can be used more flexibly. In particular, with an unchanged number of redundant data lines, for instance per memory segment, the intention is to enable a more versatile assignment of the redundant data lines and thereby to reduce the reject rate of semiconductor memories without having to provide additional substrate area for redundant data lines or other redundant structures.

Another embodiment of the invention provides an integrated semiconductor memory comprising a plurality of data lines via which data read out or to be read out from memory cells can be communicated, wherein the data lines comprise redundant data lines and non-redundant data lines, wherein the semiconductor memory has at least one data distributor line, and wherein a plurality of redundant data lines are connected up to the at least one data distributor line in such a way that in each case a redundant data line or a group of redundant data lines can be selected whose data are forwarded to the data distributor line.

According to an embodiment of the invention, the semiconductor memory has a data distributor line which can optionally receive data from a plurality of data lines. By means of the data distributor line provided according to an embodiment of the invention, data can optionally be communicated from one data line or from the other data line or from an arbitrary third data line to the data distributor line. The data distributor line is therefore connected to a plurality of redundant data lines, but in such a way that the conductive connection is in each case produced only to one redundant data line or to a selection of redundant data lines since only data of one address should be received per data distributor line. Consequently, with the aid of the data distributor line provided according to an embodiment of the invention, data which are assigned to different memory addresses and are therefore communicated by different redundant data lines can be read out via the same output-side connecting line (which is disposed downstream of the data distributor line). In this way, the data distributor line combines the path sections for data of a plurality of redundant memory addresses that are to be communicated. As soon as, during operation of the semiconductor memory, one of the redundant memory addresses is activated and the corresponding data are communicated to the data distributor line via the respectively assigned redundant data line, the data distributor line forwards the data in order to output the data.

Consequently, on the output side, that is to say, on the side of external terminals of the semiconductor memory, the data distributor line can output data corresponding to different areas of the memory cell array on the semiconductor chip (and therefore to different geometrical memory addresses) since the data distributor line can optionally be connected to a plurality of redundant data lines.

Consequently, for forwarding data via one of a plurality of redundant data lines, the respective redundant data line can be connected to the data distributor line selectively with respect to the rest of the redundant data lines, that is to say, from a group of a plurality of redundant data lines which are connected up to the same data distributor line in each case, an arbitrary one of these redundant data lines can be short-circuited with the data distributor line. The conventionally defined, invariable assignment of each individual redundant data line to an individual memory segment is thereby obviated; each redundant data line can instead be used optionally for an arbitrary memory segment of a plurality of memory segments in order to replace a non-redundant data line of the relevant memory segment.

Consequently, the number of repairable data lines per memory segment is limited only by the number of redundant data lines per data distributor line, but no longer by a number of redundant data lines fixedly assigned to the relevant memory segment. If, by way of example, a single redundant data line is provided per memory segment and, for example, N data distributor lines are provided to which in each case one of the redundant data lines can be connected, then N non-redundant data lines of an arbitrary memory segment can be replaced simultaneously. In a conventional semiconductor memory with only one redundant data line per memory segment, the semiconductor memory would already be unusable with two defective regular data lines (or defective memory areas to which a regular data line is in each case assigned) in at least one memory segment.

An embodiment of the invention therefore increases the flexibility of the use of redundant data lines and reduces the reject rate without having to accept losses of substrate area.

It is preferably provided that the redundant data lines are connected up to the at least one data distributor line via switching elements. Furthermore, it is preferably provided that with the aid of the switching elements, a respective redundant data line can be connected to each data distributor line selectively with respect to other redundant data lines.

By means of the switching elements, in each case one of the data lines can be short-circuited with the data distributor line. The short-circuiting takes place by means of a switching element being activated or turned on, and for instance by means of reversible programming of the assigned switching element.

It is preferably provided that, with the aid of the switching elements, a redundant data line or a group of a plurality of redundant data lines can be connected to the at least one data distributor line selectively with respect to the rest of the redundant data lines. Consequently, the switching elements are controlled in such a way that when one or a plurality of specific redundant data lines are conductively connected to the data distributor line (or to the data distributor lines) by means of the corresponding switching elements, the rest of the switching elements are turned off. In particular, the switching elements can be controlled in such a way that each data distributor line is conductively connected to at most one redundant data line at each point in time.

It is preferably provided that the semiconductor memory has a plurality of selection units, wherein the at least one data distributor line is in each case connected to first input terminals of the selection units. The selection units can firstly serve to select whether data received from regular data lines or data received from redundant data lines are output. The selection units can furthermore serve to select the output terminal of the semiconductor memory to which data received via the data lines are forwarded.

Accordingly, it is preferably provided that the selection units furthermore have output terminals that output data forward to the selection units.

It is preferably provided that the selection units furthermore have second input terminals, to which are connected non-redundant data lines or lines connected downstream of the non-redundant data lines. In particular, it is provided that the selection units enable outputting optionally of data received via the first input terminals or of data received via the second input terminals.

It is preferably provided that an arbitrary one of the redundant data lines can be connected to an arbitrary one of a plurality of selection units with the aid of the at least one data distributor line and the switching elements. This enables an even more flexible utilization of the redundant data lines since not just the selection of which redundant data line is intended to replace a defective, non-redundant data line of a specific memory segment is freely selectable, but the respective output terminal to which the data communicated via the redundant data line are intended to be conducted, is likewise freely selectable.

It is preferably provided that the output terminals of the selection units are connected to output amplifiers for outputting data from the semiconductor chip. The output terminals can likewise be used for the reception of data by the semiconductor memory from the outside. In this case, all the data lines can be used as bidirectional data lines. The rest of the embodiments of the invention, and also the central concept of the invention apply, of course, in the same way to the writing of data received by the semiconductor memory in the memory cells of the semiconductor memory. In this case, the data to be written are merely sent in the opposite direction along the at least one data distributor line and the redundant and non-redundant data lines. The data distributor lines provided according to an embodiment of the invention and also the redundant data lines can therefore be used equally for writing as well as for read-out.

It is preferably provided that the semiconductor memory has at least one selection decoder which is connected to a plurality of non-redundant data lines and is controlled in such a way that it forwards data communicated via a non-redundant data line or a group of non-redundant data lines and in the process blocks the forwarding of the data of the other non-redundant data lines to which the selection decoder is connected. The selection decoder thus serves for selecting the data to be forwarded from (or to) one or alternatively more than one, from a plurality of non-redundant data lines. The plurality of data lines can, in particular, comprise the data lines which are assigned to a memory segment. The selection decoders thus serve for selectively forwarding the data received via a group of non-redundant data lines (for instance those associated with a memory segment). In particular, the selection decoders are intended to select those non-redundant data lines whose signals are in each case intended to be forwarded or to which signals are in each case intended to be forwarded.

It is preferably provided that the at least one selection decoder is assigned to precisely one output amplifier connected downstream of the selection decoder. Furthermore, it is preferably provided that the at least one selection decoder is connected up to the output amplifier assigned thereto via one or a plurality of lines connected downstream and one of the selection units. In particular, the selection decoder can be connected, on the output side, to the second input terminals of a selection unit which outputs at its output terminals optionally the data forwarded via the selection decoder or the data forwarded via redundant lines (and also the at least one data distributor line), which it receives via the first input terminals. The selection units thus serve to select whether data are to be read out via redundant or via normal, non-redundant data lines.

It is preferably provided that each selection unit is controlled in such a way that it forwards to the output amplifier optionally data received from the respective selection decoder or data received via the data distributor line.

It is preferably provided that each redundant data line and each non-redundant data line is connected to at least one sense amplifier to which two bit lines are connected. Furthermore, it is preferably provided that each redundant data line and each non-redundant data line is connected to a group of sense amplifiers. By way of example, each data line can be connected to a group of precisely four sense amplifiers. The data lines can be connected via separate terminal connections to a respective pair of sense amplifiers, each pair of the amplifiers being arranged on either one side or the other, opposite side of the memory cells to be driven.

It is preferably provided that each redundant data line and each non-redundant data line is permanently conductively connected to all the sense amplifiers of a group of sense amplifiers. In this case, the sense amplifiers of the same group can be controlled by further signals in such a way that in each case only one of the sense amplifiers passes on its signals to the relevant data line.

For this purpose, it is preferably provided that the semiconductor memory has at least one group of select lines, wherein there is connected to each select line for a plurality of groups of sense amplifiers in each case one sense amplifier per group, and wherein the groups of sense amplifiers are in each case assigned to different redundant data lines and/or non-redundant data lines. By way of example, if each group has precisely four sense amplifiers, four select lines can be provided, activation of the respective select line defining which or which numbered sense amplifier of each group in each case forwards its data to the respective (redundant or else non-redundant) data line.

Accordingly, it is preferably provided that with the aid of the select lines it is possible to select which sense amplifier within the groups of sense amplifiers in each case forwards data to the relevant data line connected to the respective group of sense amplifiers.

Furthermore, it may be provided that each sense amplifier is connected to in each case two bit lines which serve for reading out from memory cells which are connected to the bit lines and to a group of word lines. The memory cells may have in particular a selection transistor and a storage capacitor, for example, a trench capacitor or a stacked capacitor. The semiconductor memory need not necessarily be a DRAM, however, and the memory cells can also be constructed in a different way.

It is preferably provided that at least those memory cells whose data can be read out via non-redundant data lines connected to a common selection decoder are connected to the same group of word lines. However, the word lines can also extend over an area of a plurality of partial areas of the semiconductor memory whose memory cells can be read (and/or written to) via regular, that is to say non-redundant, data lines which lead to a plurality of selection decoders and accordingly to a plurality of output amplifiers. The word lines can, in particular, extend over a plurality of memory segments.

It is preferably provided that the semiconductor memory has a plurality of selection decoders which are in each case connected to a group of non-redundant data lines having in each case an identical number of non-redundant data lines. Furthermore, it may be provided that the non-redundant data lines of their plurality of selection decoders run parallel to one another, and that in each case one or a plurality of redundant data lines run between mutually adjacent groups of non-redundant data lines. Here a group of non-redundant data lines is understood to be a set of data lines (generally directly adjacent to one another) which lead to the same selection decoder and are therefore, for example, also read via the same output amplifier. The redundant data lines can then be arranged, in particular, between the groups of regular data lines.

It is preferably provided that the redundant data lines in each case pass through between adjacent groups of non-redundant data lines and end at the switching elements via which they are connected to the at least one data distributor line. If a number of a plurality of redundant data lines are provided between the mutually adjacent groups of regular data lines, a number of data distributor lines corresponding to this number is preferably provided. Each additional data distributor line enables a further regular data line to be replaced by one redundant data line per memory segment.

It is preferably provided that the sense amplifiers to which the redundant data lines are connected, are connected to the same select lines as the sense amplifiers to which the non-redundant data lines of the adjacent groups of non-redundant data lines are connected. Not only the select lines but also the rest of the structures of the regular memory cell array, for instance the memory cells, word lines, bit lines or sense amplifiers, can be provided and formed for the partial areas of the semiconductor memory that are provided as redundancy in the same way as for the non-redundant partial areas. It is not necessary to form the redundant areas in a manner isolated from the regular areas of the memory cell array; they can generally be integrated together and connected up to one another.

It is preferably provided that in each case precisely one redundant data line or precisely one pair of redundant data lines passes through between, in each case, two adjacent groups of non-redundant data lines that are, in each case, connected to a dedicated selection decoder. In a conventional semiconductor memory, the redundant data lines passing through on the substrate surface could be used at best for one or the other adjacent group of regular data lines for repair. In the semiconductor memory according to an embodiment of the invention, however, they can also be used, despite their spatial position, for any other memory area, for instance a memory segment arranged further away, in order to replace a regular data line there. This is made possible according to an embodiment of the invention with the aid of the at least one data distributor line.

It may be provided that the sense amplifiers are in each case arranged in alternating succession at opposite sides of at least one group of word lines.

The data lines can be arranged at a greater distance from a substrate of the semiconductor memory than the sense amplifiers, and they can lead across the select lines. In this case, the data lines are arranged above the sense amplifiers and the select lines as seen in the plan view of the substrate.

It is preferably provided that each data line is formed as a pair of two mutually complementary individual lines which together in each case communicate a data value in the form of a potential difference between the potentials of the two individual lines. In this way, particularly in the case of high-frequency data transmission, the data can be communicated more reliably and with the aid of smaller supply voltages since the voltage difference between two mutually complementary data lines is in each case evaluated instead of the voltage swing of an individual data line as a signal. Consequently, preferably, each data line comprises a pair of mutually complementary individual lines. This applies both to the non-redundant, regular data lines and to the redundant data lines.

It is preferably provided that each data distributor line can be connected to an arbitrary output amplifier from a plurality of output amplifiers with the aid of the selection units, wherein in each case a selected selection unit blocks a forwarding of data from a selection decoder connected upstream and the rest of the selection units forward data received from the rest of the selection decoders to the rest of the output amplifiers. Consequently, the output amplifier can be selected with the aid of a selection unit which activates its first input terminals instead of its second input terminals, to which output terminal redundant data (or data which are received via redundant lines) are then output. Likewise, when writing to the semiconductor memory in the opposite direction it is possible to control from which input terminal or output terminal a data distributor line receives the data to be stored. With the aid of the at least one data distributor line it is then possible to control to which redundant data line the received data are forwarded.

It is preferably provided that each redundant data line can be driven in such a way that it can be addressed instead of a non-redundant data line from an arbitrary group of non-redundant data lines which is able to be connected via a selection decoder to the same selection unit as the relevant redundant data line.

Finally, it may be provided that the switching elements are transistors. They may be formed as a field effect transistor, for example. The switching elements may also be constructed as more complex switching units. Finally, it is provided that the semiconductor memory is a volatile read/write memory, that is to say a random access memory.

An embodiment of the invention furthermore provides a method for operating an integrated semiconductor memory, wherein the method comprises the following providing an integrated semiconductor memory, wherein the semiconductor memory is configured in such a way that after the semiconductor memory has been switched on, the redundant data lines which are connected up to the at least one data distributor line are electrically isolated from the data distributor line and can optionally be connected individually to the data distributor line, and connecting a redundant data line from the plurality of redundant data lines to the data distributor line and forwarding data read out or to be read out from at least one memory cell via the redundant data line connected to the data distributor line and via the data distributor line.

It is preferably provided that the redundant data line is short-circuited with the data distributor line via a turned-on switching element, while further switching elements remain turned off and electrically isolate the rest of the redundant data lines of the plurality of redundant data lines from the data distributor line. Furthermore, it is preferably provided that data received via the redundant data line are forwarded by the data distributor line to a selection unit, which outputs the data instead of data received via non-redundant data lines. Furthermore, it may be provided that the selection unit outputs the data forwarded by the data distributor line to an output amplifier of the semiconductor memory.

It is preferably provided that a semiconductor memory, comprising a plurality of groups of non-redundant data lines, is provided, in which the redundant data lines can be assigned in freely selectable fashion to an arbitrary group of non-redundant data lines, and wherein, when a non-redundant data line has to be replaced in a group of non-redundant data lines, one of the redundant data lines is activated as an alternative instead of the non-redundant data line to be replaced in the group.

The semiconductor memory operated in this way can be formed according to any one of the embodiments described.

An embodiment of the invention furthermore provides a method for operating an integrated semiconductor memory, wherein the method comprises the following providing an integrated semiconductor memory, wherein the semiconductor memory is configured in such a way that after the semiconductor memory has been switched on, the redundant data lines which are connected up to the at least one data distributor line are electrically isolated from the data distributor line and can optionally be connected individually to the data distributor line, and connecting a redundant data line from the plurality of redundant data lines to the data distributor line and communicating data to be written to at least one memory cell via the data distributor line and the redundant data line connected thereto.

It is preferably provided that the one redundant data line is short-circuited with the data distributor line via a turned-on switching element, while further switching elements remain turned off and electrically isolate the rest of the redundant data lines of the plurality of redundant data lines from the data distributor line.

It is preferably provided that the data to be written to the at least one memory cell are communicated via a selection unit, which can optionally be connected to the data distributor line or to a group of non-redundant data lines, to the data distributor line instead of to the group of non-redundant data lines.

It is preferably provided that a semiconductor memory comprising a plurality of groups of non-redundant data lines is provided, in which the redundant data lines can be assigned in freely selectable fashion to an arbitrary group of non-redundant data lines, and wherein, when a non-redundant data line has to be replaced in a group of non-redundant data lines, one of the redundant data lines is activated as an alternative instead of the non-redundant data line to be replaced in the group.

The semiconductor memory operated in this way can be formed according to any one of the embodiments described.

BRIEF DESCRIPTION OF THE DRAWINGS

The invention is described below with reference to the figures, in which.

DETAILED DESCRIPTION OF ILLUSTRATIVE EMBODIMENTS

Figure 1:
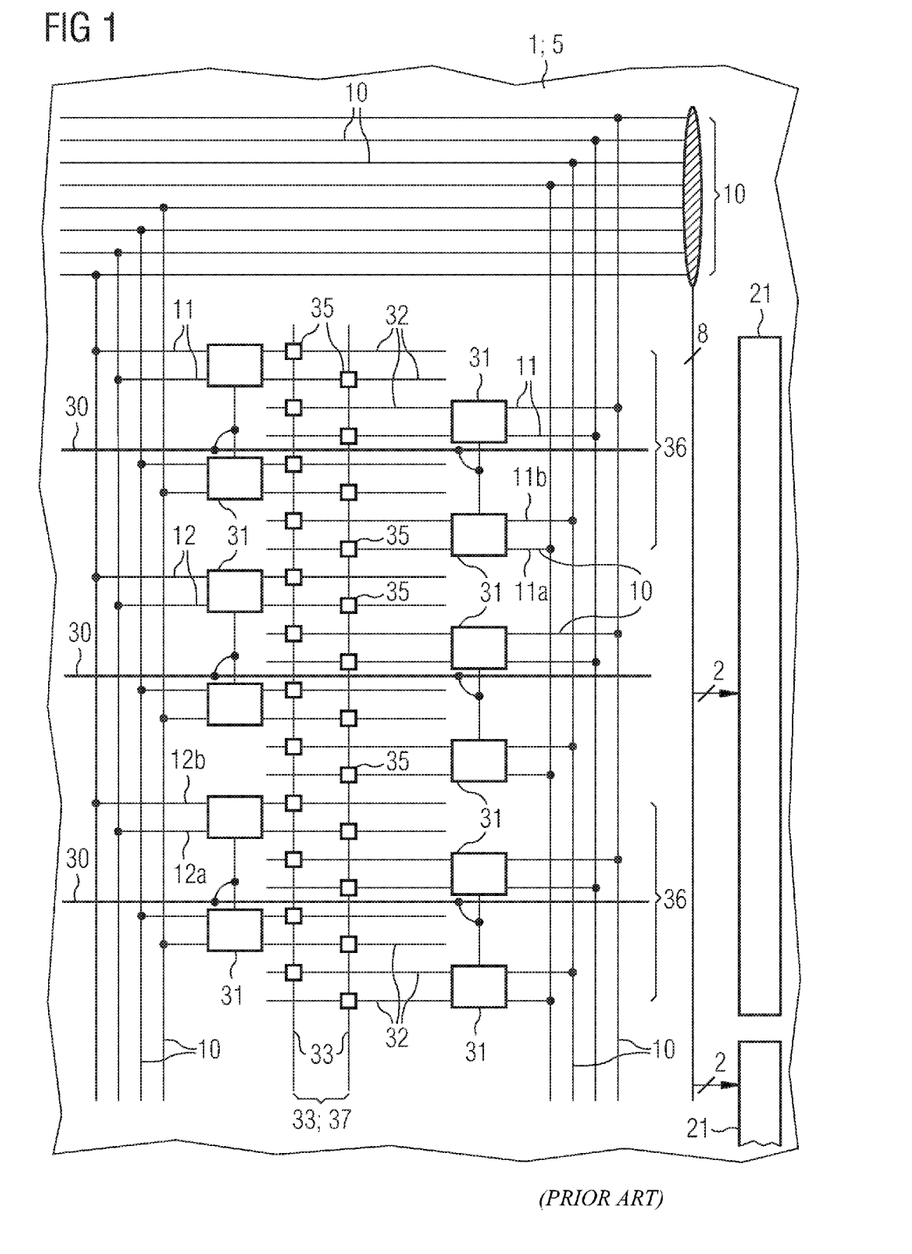
FIG. 1 shows a conventional semiconductor memory with fixed assignment of the redundant data lines.

FIG. 1 shows a schematic plan view of a conventional semiconductor memory 1, on the substrate 5 of which a plurality of memory cells 35 are formed. The semiconductor memory 1 may be a DRAM or some other volatile semiconductor memory. The semiconductor memory may likewise be a nonvolatile semiconductor memory. The memory cells 35 are usually connected to the bit lines 32 and also to word lines 33. The memory cells 35, which may contain for example a storage capacitor and a selection transistor, are read, for example, with the aid of sense amplifiers 31, to which are connected in each case two mutually complementary bit lines 32, the potentials of which are compared with one another and spread. When the bit line potentials are spread by a sense amplifier, the potential difference between the two bit line potentials is increased. Proceeding from the sense amplifiers 31, the data are forwarded via data lines 10 for read-out. The data lines may comprise master data lines, inter alia, which are illustrated running horizontally at the top in FIG. 1 and are illustrated as a group of eight master data lines running parallel to one another. Further data lines, illustrated for instance running vertically in groups of four in FIG. 1, may be connected upstream of the master data lines. The sense amplifiers in each case forward the read-out data value to a data line. In the case of the semiconductor memory in accordance with FIG. 1, the data can be communicated, for example, in the form of potential differences between two individual lines in each case. Thus, each data line that communicates a data value may be formed in the form of a line pair composed of two individual lines. By way of example, two individual lines 12a, 12b may together form a data line that communicates a data value read out from a sense amplifier 31. The data value, which corresponds to a digital zero or one, corresponds to the potential difference between the two individual lines 12a and 12b. The eight master data lines then forward a total of four data values in parallel.

The data lines 10 may comprise regular, non-redundant data lines 12 and also redundant data lines 11. The redundant data lines 11, too, may in each case be formed as a pair of individual lines 11a, 11b. Redundant lines are not driven automatically, but rather are activated only when, after defective memory areas have been identified, the defective memory areas are replaced by redundant memory areas. In this case, the data values communicated from the alternatively activated memory areas are forwarded with the aid of redundant data lines, whereas the regular data lines of the defective memory areas are not deactivated. Such a repair of a semiconductor memory is usually effected by the switching of fuse elements, for example, fuses or antifuses, whereby a rerouting of data which are assigned to specific memory addresses is permanently preset, namely to the redundant memory areas.

In FIG. 1, the sense amplifiers 31 are arranged in groups of 36 each of four sense amplifiers 31. Each group 36 of sense amplifiers 31 is assigned a respective select line 30, via which the four sense amplifiers 31 of the respective group 36 are in each case activated. A plurality of groups 36 of sense amplifiers are arranged alongside one another; the memory cells 35 thereof are connected to a group 37 of word lines 33, but to respectively different bit lines 32. According to a preselected memory address for writing or reading out data, one of a plurality of select lines 30 is activated, whereby the respective four sense amplifiers 31 of the relevant group 36 are activated. This has the effect during a read-out operation, for example, that the four sense amplifiers 31 of the addressed, selected group 36 output their data via the data lines 10 and 11 or 12. The data are forwarded firstly as far as the master data lines and from there to a respective output amplifier 21. As illustrated schematically in FIG. 1, in each case two of the eight master data lines lead to a relevant output amplifier 21. The eight master data lines (which represent, for example, four line pairs each composed of two individual lines) are therefore connected to four output amplifiers 21. The output amplifiers 21 are connected upstream of the input/output terminals of the semiconductor memory 1.

If a specific memory address is addressed by activation of a specific select line 30, the data previously stored in the memory cells are read out via the respective data lines 10 and output via the output amplifiers 21. Normally, only regular, non-redundant memory addresses are addressed and their data are forwarded via regular, non-redundant data lines 12. However, if a partial area of the semiconductor memory is defective in the area of one or more memory addresses, as an alternative other, redundant memory areas have to be permanently activated instead of the defective memory areas and the defective memory areas have to be deactivated. This is done in such a way that the line connections for communicating write and read data are modified in such a way that for the same logical address a different physical address is addressed on the semiconductor memory 1 (that is to say on the substrate 5 thereof). In FIG. 1, by way of example, the topmost group 36 of sense amplifiers is provided as redundant partial area of the semiconductor memory; respective redundant data lines 11 and 11a, 11b lead on from the four sense amplifiers. The redundant memory area is driven by the topmost select line 30 illustrated in FIG. 1, but only after and provided that, during the repair of the semiconductor memory, the select line and the assigned redundant memory area have been activated as an alternative instead of a defective, regular memory area (for instance instead of some other non-redundant group 36). Below the three groups 36 each of four sense amplifiers with the respectively assigned bit lines and memory cells as illustrated in FIG. 1, a plurality of further groups 36 or physical memory addresses are also provided, which are not illustrated in FIG. 1 for space reasons. By way of example, 32 or 64 regular groups 36 of sense amplifiers together with the assigned memory areas can be provided, for example, below the redundant group 36 of sense amplifiers that is illustrated right at the top. These 32 or 64 memory areas each with a dedicated select line 30 and additionally one or two further, redundant memory areas can be combined to form a single memory segment whose data are forwarded by common data lines to the master data lines and from there to the output amplifiers.

In the case of such a memory segment, in conventional fashion the redundant data lines and also the redundant memory areas connected thereto are fixedly assigned to the respective memory segment. This means that only a few of the 32 or 64 physical addresses of the respective memory segment can be replaced by a logical address fixedly assigned to this memory segment. If, by way of example, the topmost select line 30 leading to the topmost group 36 of sense amplifiers 31 and illustrated in FIG. 1 and also a bottommost select line 30, which is not illustrated in FIG. 1, are in each case assigned to a redundant physical memory address, then a total of two redundant memory addresses are available for the 32 or 64 regular memory addresses. This means that at most two of the 32 or 64 memory addresses are permitted to be defective. If there is an even higher number of defective memory addresses per memory segment, the semiconductor memory 1 can no longer be operated reliably and has to be rejected.

Although the number of redundant physical memory addresses per memory segment or per other memory unit on the semiconductor substrate can be increased if the additional redundant areas are concomitantly included in planning the design of the semiconductor memory, this is associated with an additional loss of substrate area. On the other hand, maintaining the previously predetermined number of redundant memory addresses per memory segment means that the reject rate of semiconductor memories produced cannot be reduced further if a specific proportion of the semiconductor memories, on at least one memory segment, have more than the respective number of defective memory addresses.

Figure 2:
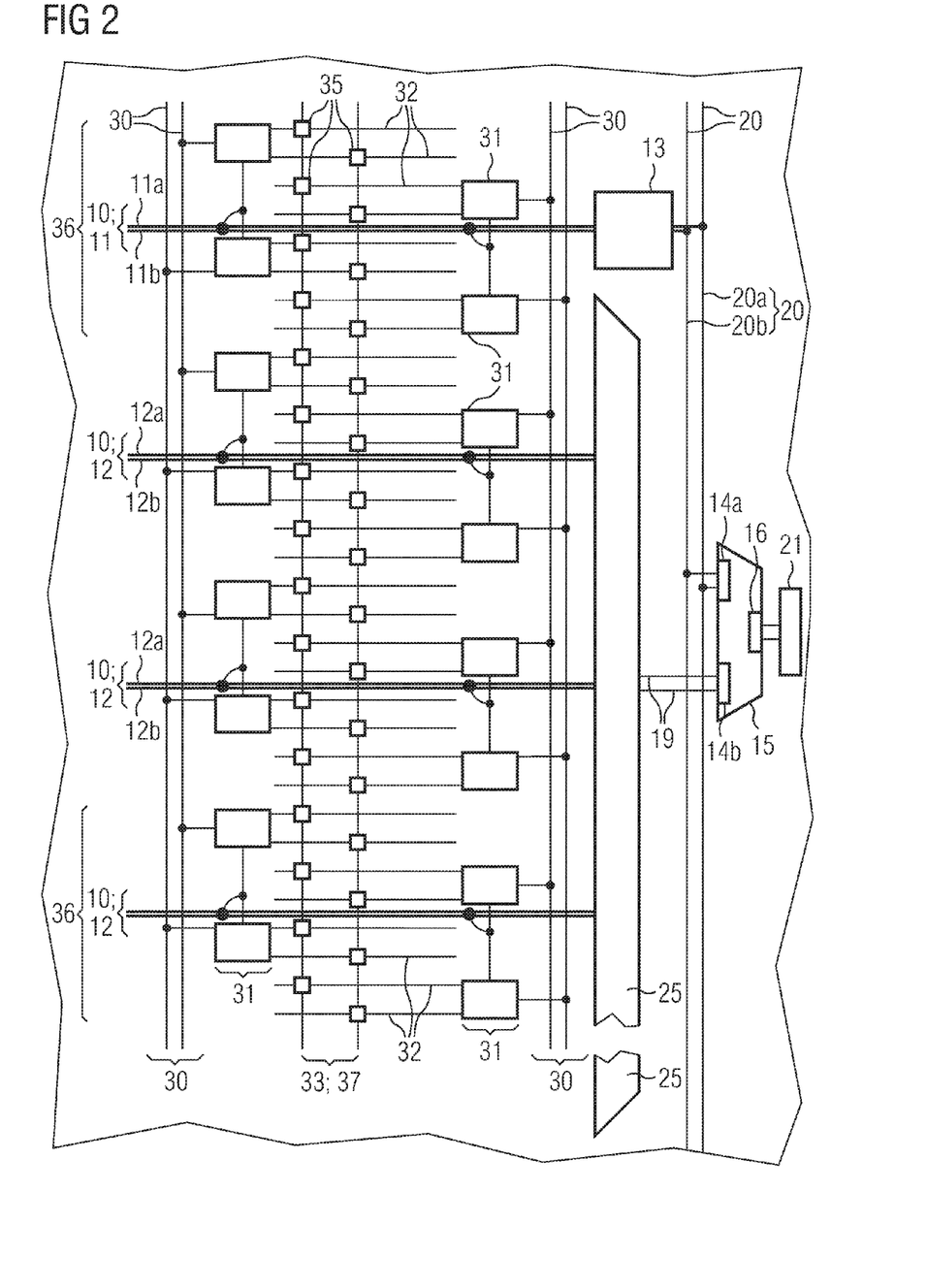
FIG. 2 shows a semiconductor memory according to the invention in accordance with one possible embodiment.

FIG. 2 shows a schematic plan view of a semiconductor memory according to an embodiment of the invention, in which a data distributor line 20 is provided, by means of which data read out (or written in) via redundant data lines 11 can be assigned to different memory areas. FIG. 2 illustrates a pair of individual lines 20a, 20b, which together produce the at least one data distributor line 20 and can be used for forwarding a respective data value per unit time. In FIG. 2, the data distributor line 20 extends beyond the plane of the drawing; it leads, as also illustrated below in FIG. 3, through to further memory segments which in each case have a predetermined number N of regular memory addresses and non-redundant data lines 12. FIG. 2 illustrates only an excerpt from a memory area (for example a memory segment) which has a plurality of, for example, 32 or 64 non-redundant data lines 12, only the topmost three non-redundant data lines 12 are illustrated in FIG. 2 for space reasons. Furthermore, a redundant data line 11 is illustrated at the top in FIG. 2, which redundant data line, although it runs close to the adjacent non-redundant data lines 12, is not fixedly assigned to a specific memory area or memory segment. Instead, the redundant data line 11 is connected up to the data distributor line 20 in such a way that the non-redundant data line 12 can be short-circuited with the data distributor line, so that the data of the redundant data line 11 can be forwarded via the data distributor line 20 more flexibly than is conventionally possible.

A switching element 13 may be provided, which is connected between the redundant data line 11 and the data distributor line 20 and, when it is turned on, short-circuits the redundant data line 11 with the data distributor line 20. In the turned-on state of the switching element 13, the data distributor line 20 thus serves for reading from the redundant data line 11 illustrated at the top in FIG. 2. Outside the plane of the drawing in FIG. 2, still further redundant data lines 11 can be connected to the data distributor line 20 in the same way as also explained below with reference to FIG. 3. The data distributor line 20 thus serves for forwarding data whose physical source address can be freely selected with the aid of the switching elements 13 or other units. The data distributor line 20 thus optionally combines data of a plurality of memory addresses, but communicates only one data value of a specific redundant data line 11 at each point in time. During the opposite operation, writing data to redundant memory addresses with the aid of the redundant data lines 11, the data can be sent to the desired redundant data line 11 with the aid of the data distributor line 20.

Consequently, the addressing of the redundant data lines 11 when reading and writing data can be handled more flexibly than in conventional semiconductor memories. By virtue of the fact that the data distributor line 20 is no longer assigned to a specific memory area or memory segment, the conventionally fixed assignment of the redundant data lines 11 to the memory areas or memory segments is cancelled. Therefore, it is possible for the first time to repair as many memory addresses as desired in a concrete memory area or memory segment. A number of repairable memory addresses per memory segment is limited only by the total number of data distributor lines and the (even greater) number of redundant data lines 11 that can be connected thereto overall.

The data distributor line 20, moreover, as well as the non-redundant and redundant data lines 12, 11 in FIG. 2 are likewise illustrated as double lines, that is to say as line pairs composed of two complementary individual lines in each case.

With the aid of the data distributor line 20, the received data can be forwarded to an output amplifier 21. In particular, there is the possibility of forwarding data received via the data distributor line 20 to different, optionally drivable output amplifiers 21. For this purpose, a selection unit 15 can be connected upstream of each output amplifier 21, which selection unit is connected to the data distributor line 20 via a first input terminal 14a and to the output amplifier 21 via an output terminal 16. With the aid of the selection units 15 and the output amplifiers 21, of which only one specimen in each case is illustrated in FIG. 2 for space reasons, the data obtained via the data distributor line 20 can in each case be assigned to a specific one of a plurality of output amplifiers 21 and be forwarded to it. Consequently, the output terminal to which the data received via the data distributor line 20 are forwarded can be selected freely. As a result, since the data distributor line can optionally be connected to an arbitrary redundant data line 11 from a plurality of redundant data lines, the data obtained via redundant data lines 11 can be communicated to an arbitrary output amplifier 21. Even when each output amplifier 21 is assigned to a specific memory area or memory segment, it is nevertheless possible to freely select which memory segment or memory area is intended to be assigned the data read out via a redundant data line 11. The data distributor line 20 thus makes it possible to cancel the conventionally defined assignment of a specific redundant data line 11 to a specific memory area or memory segment. This applies analogously to the writing or storage of data at redundant (physical) memory addresses with the aid of the redundant data lines and the data distributor line.

FIG. 2 illustrates only an excerpt from a single memory area or memory segment, for space reasons. The memory area extends over the length or height of a selection decoder 25, which may be provided in accordance with a preferred embodiment in order to select, from a plurality of regular, non-redundant data lines 12, a respective one whose data are in each case intended to be forwarded. The selection decoder 25 can be connected, via lines 19 connected downstream, to second input terminals 14b of a selection unit 15. The selection unit 15 can therefore select whether the data that are received via the data distributor line 20 and originate from redundant data lines 11 or the data that are received via the selection decoder 25 and originate from non-redundant data lines 12 are selected and forwarded via the output terminal 16 (for example, to an output amplifier 21). FIG. 2 illustrates only a single selection decoder 25; it is broken up in the illustration and its lower end is merely indicated in order to make it clear that the number of non-redundant data lines connected to the selection decoder 25 is very much greater than just the three data lines 12 illustrated in FIG. 2. By way of example, 32 or 64 non-redundant data lines 12 can be connected to, in each case, the same selection decoder 25. Each data line 12 may comprise a line pair of two individual lines 12a, 12b which in each case communicate a potential difference between them as data signal. As a result, in particular high-frequency signals generated with small voltages can be reliably communicated. A dedicated selection unit 15 having in each case a first input terminal 14a and a second input terminal 14b is provided for each memory segment, that is to say for each selection decoder 25. The relevant selection unit 15 controls, also for that memory segment which corresponds to the respective selection decoder 25, whether redundant data (or data received via redundant data lines) are intended to be communicated instead of non-redundant data.

FIG. 2 illustrates, in the same way as in FIG. 1, in each case groups 36 of in each case four sense amplifiers 31, once again two mutually complementary bit lines 32 that in each case connect a plurality of memory cells being connected to each sense amplifier. For the sake of clarity, FIG. 2 only illustrates two word lines 33 representing a significantly greater number of word lines 33 which form a group 37 of word lines. In each case two sense amplifiers 31 of each group 36 of sense amplifiers are arranged on opposite sides of the group 37 of word lines 33. Issuing from the sense amplifiers 31 are line connections via which the sense amplifiers are permanently conductively connected to the respective data line 11 or 12. Connected upstream of the sense amplifiers 31 are select lines 30, which run in the vertical direction in FIG. 2 and in each case connect a sense amplifier 31 of each group 36 of sense amplifiers. Usually, only one of the four select lines 30 is activated, so that in each case a specific sense amplifier 31 of each group 36 forwards its read-out data values to the data line 10, or 11 or 12. Depending on whether the relevant group 36 of sense amplifiers together with the memory cells assigned to it is arranged in an originally driven or originally non-driven partial area of the semiconductor memory, the data lines 10 are regular, non-redundant data lines 12 or redundant data lines 11. In the latter case, the data lines are connected to the at least one data distributor line 20 via a switching element 13 or in some other way and are therefore not assigned to a defined memory area or memory segment (represented by the associated selection decoder 25 in FIG. 2). Instead, data communicated via the redundant data lines 11 can be sent to an arbitrary output amplifier 21 via the data distributor line 20 and via one of a plurality of selection units 15. They are therefore interspersed between those data which are otherwise received from the respective memory segment via the second input terminals 14b of the relevant selection unit and the selection decoder 25 connected upstream.

In FIG. 2, the at least one data distributor line 20 also extends outside the illustrated excerpt from the semiconductor memory along a plurality of memory segments or selection decoders 25; in the area of each selection decoder 25, the at least one data distributor line 20 has issuing line branches which lead to first input terminals of a respective selection unit 15. This is illustrated in greater detail in FIG. 3.

Figure 3:
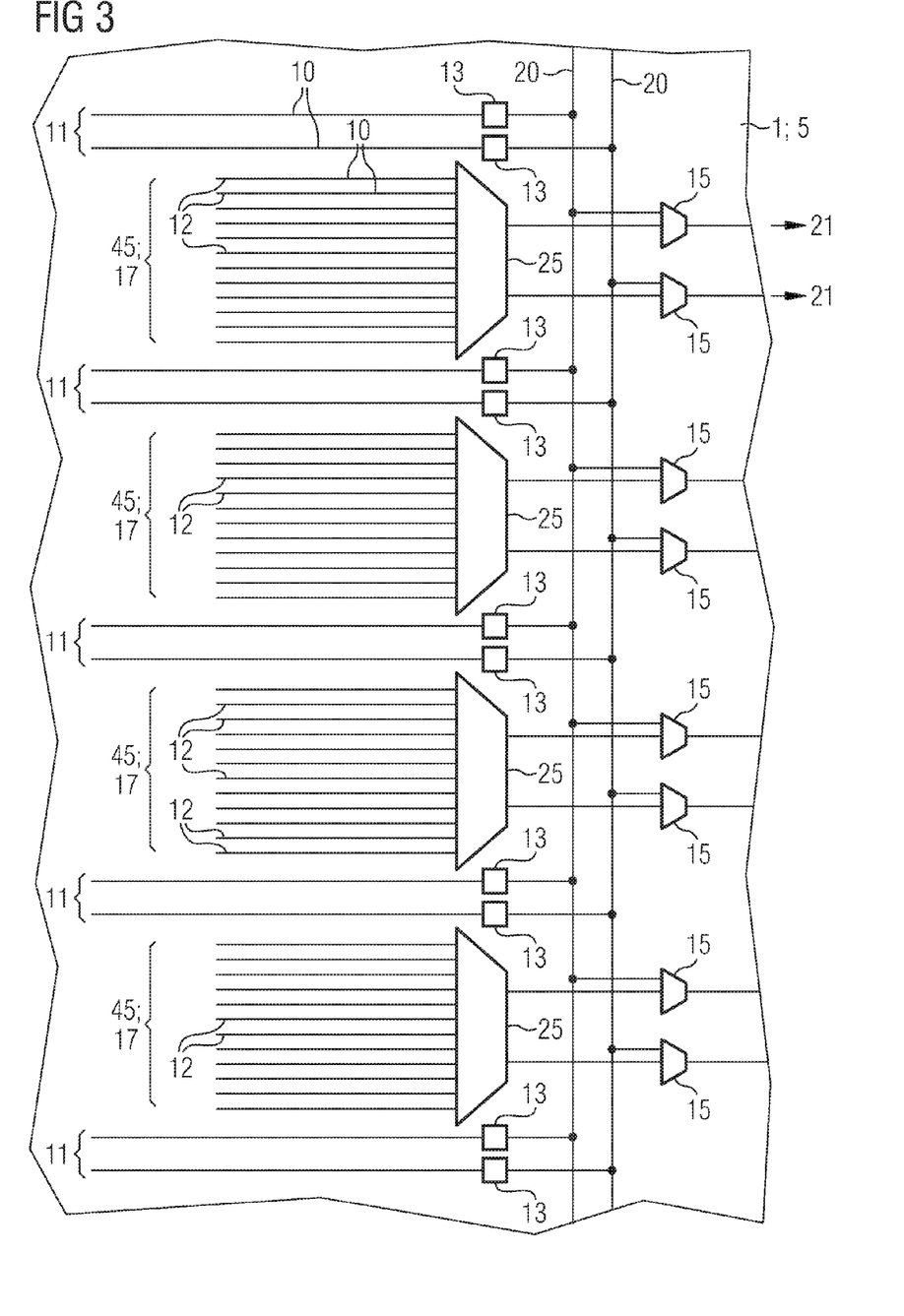
FIG. 3 shows a further view of the semiconductor memory from FIG. 2.

FIG. 3 shows a schematic plan view of a (larger) excerpt from the semiconductor memory 1 from FIG. 2. Four memory areas, for instance memory segments 45 are illustrated in the area of the substrate 5 of the semiconductor memory 1 that is illustrated in FIG. 3, each memory segment 45 comprising a group 17 of a plurality of non-redundant data lines 12. The non-redundant data lines 12 in each case lead to a selection decoder 25. Redundant data lines 11 are in each case provided between the memory segments 45, that is to say between the groups 17 of regular, non-redundant data lines. In the illustration in FIG. 3, each data line is illustrated as an individual line, but can optionally represent a double line composed of two individual lines or merely a single individual line; the illustration of double lines has been dispensed with in FIG. 3 for reasons of clarity. The same applies to the data distributor lines 20, of which two mutually independent data distributor lines 20 are illustrated in FIG. 3.

Two different data can be communicated simultaneously with the aid of the two data distributor lines 20; each of the two data distributor lines 20 illustrated serves for forwarding a respective data value. The two data distributor lines 20 illustrated in FIG. 3 therefore do not represent individual lines of a related line pair, but rather serve for forwarding different data values. This is also evident from the fact that FIG. 3, which in this regard represents a development of the embodiment illustrated in FIG. 2, illustrates per memory segment 45 or per selection decoder 25 in each case two selection units 15, of which in each case the upper selection unit 15 is connected to the left-hand data distributor line 20 and the respective lower selection unit 15 is connected to the right-hand data distributor line 20. The input terminals and output terminals 14a, 14b, 16 are arranged in a manner similar to that in FIG. 2 and are therefore not illustrated especially in FIG. 3.

For each memory area 45, instead of the selection decoder 25 provided, it is also possible to provide a pair of selection decoders 25 each having half as many connected non-redundant data lines 12; in this case, each selection decoder is once again connected, as in FIG. 2, to precisely one selection unit 15. Both embodiments can equally be realized.

FIG. 3 illustrates that the at least one data distributor line 20 extends across a plurality of memory segments 45 and is connected to a plurality of redundant data lines 11. It is evident on the basis of the plurality of switching elements 13 and the plurality of selection units 15. With the aid of the switching elements 13 it is possible to select the redundant data line 11 from which the respective data distributor line 20 is intended to receive the data (for reading out data from redundant memory areas) or which redundant data line it is in each case intended to send data to (for storage in redundant memory areas). In the case of a read operation, for instance, the switching elements 13 can be used to set the redundant data line 11 from which data to be read out are intended to be read out from redundant memory cells.

The selection units 15 can furthermore be used to set the output amplifier 21 or the external contact terminal of the semiconductor memory 1 to which the data received via the respective data distributor line 20 are forwarded. Each selection unit 15 can therefore forward the data received via the respective data distributor line 20 instead of some data which are communicated from a memory segment 45 and which originate from defective data lines (or defective memory areas assigned thereto). The selection decoders 25 can be configured such that they in each case simultaneously forward two data values of the data received via the respective group 17 of non-redundant data lines, namely to the two selection units 15. Likewise, instead of each selection decoder 25 illustrated in FIG. 3, a pair of selection decoders can be provided, each of which forwards only precisely one data value per unit time to in each case a single assigned selection unit 15.

With the aid of the development illustrated in FIG. 3, it is possible to exchange two non-redundant data lines 12 for redundant data lines 11 on average statistically per memory segment 45. Furthermore, however, each individual redundant data line 11 can be assigned to any arbitrary memory segment 45. Consequently, the two redundant data lines 11 illustrated at the very top in FIG. 3 can be driven in order to replace one or two defective non-redundant data lines 12 in an arbitrary one of the four memory segments 45 illustrated.

The actual advantage of an embodiment of the invention becomes clear, however, if, in FIG. 3, the number of redundant data lines 11 is reduced overall, for example if a pair of redundant data lines 11 is provided only between every next but one memory segment 45 and the succeeding memory segment 45. In this case, redundant data lines 11 would be arranged only in some interspaces between adjacent groups 17 of non-redundant data lines 12. With the aid of the data distributor lines 20, the redundant data lines 11 could then be assigned to any arbitrary memory segment 45 by switching the selection units 15 in such a way that they receive the data communicated by the data distributor lines 20 via their first input terminals and forward the data to the output amplifiers 21. Consequently, it is not necessary for a redundant data line 11 to be arranged alongside each group 17 of non-redundant data lines 12 or alongside each memory segment 45.

The total number of redundant data lines 11 limits the number of replacement addresses provided statistically per memory segment 45. However, since generally only a small proportion of the many memory segments 45 contain defective partial areas, even on average statistically a redundant data line 11 or a group of redundant data lines 11 is not necessary for every memory segment 45 or for every other memory area. Consequently, the total number of redundant lines provided for a plurality of memory areas can also be chosen to be smaller than the number of memory segments 45 of the plurality of memory segments. Thus, although on average statistically there is less than one redundant line 11 per memory segment 45, in the extreme case all the redundant data lines 11 present can be used to replace defective regular data lines, or regular data lines connected to defective partial areas, of the same memory segment 45, to be precise optionally for any arbitrary memory segment 45. Such versatility in the use of redundant data lines 11 and their assignment to memory areas, for example, to a plurality of memory segments 45, cannot be achieved with conventional means.

Figure 4:
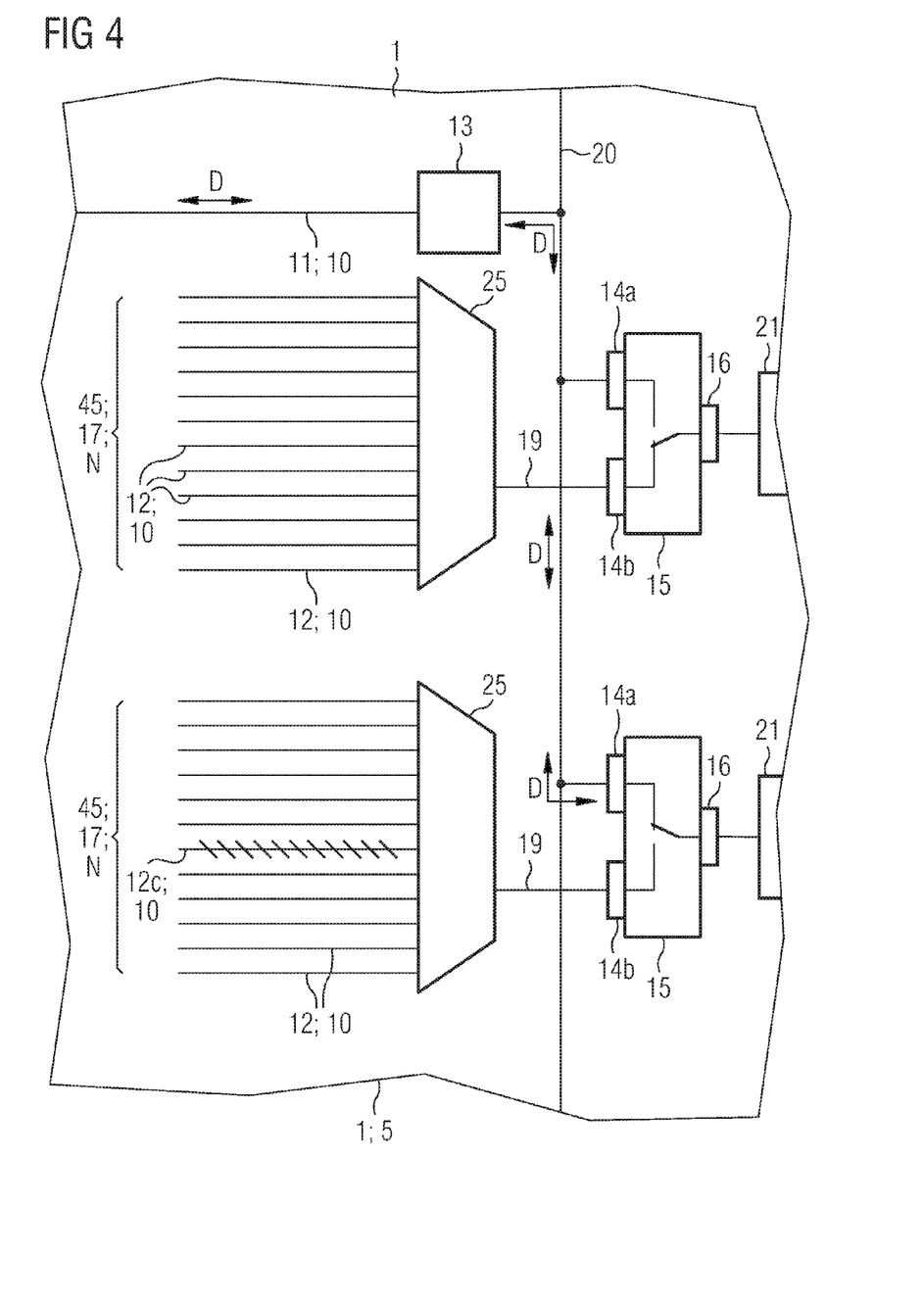
FIG. 4 shows a further view of the semiconductor memory according to an embodiment of the invention for illustrating an operating method according to an embodiment of the invention.

FIG. 4 shows a further schematic view of a semiconductor memory according to an embodiment of the invention for illustrating the method of operation of the semiconductor memory. In particular the method for operating the semiconductor memory according to an embodiment of the invention, in particular, for writing in data or for reading out data, is comprehensible with reference to FIG. 4. FIG. 4 illustrates an excerpt from the semiconductor memory 1 according to an embodiment of the invention, in which a single redundant data line 11 is illustrated, which is connected up to a data distributor line 20 via a switching element 13. The switching element 13 can be optionally turned on or turned off, so that the redundant data line 11 is either short-circuited with the data distributor line 20 (or at least electrically connected thereto) or electrically isolated from it. FIG. 4 furthermore illustrates two subunits or memory areas of the semiconductor memory 1, for instance two memory segments 45 each having a group 17 of a plurality of non-redundant data lines 12. The non-redundant data lines 12 of a group 17 are in each case jointly connected to a respective selection decoder 25. As illustrated in FIG. 4, in the lower group 17 one data line of the non-redundant data lines 12 is defective. This defective data line 12c can no longer be used, whether it be owing to a defect in the data line itself or owing to a defect within the memory structures that are assigned to it or are to be addressed by it, such as, for example, signal amplifiers, memory cells, word lines, bit lines or other partial structures. FIG. 4 furthermore shows two selection units 15 with their respective first and second input terminals 14a, 14b and their respective output terminal 16, via which they can be connected, for example, to an output amplifier 21. FIG. 4 illustrates the internal construction of the selection units 15 schematically in a simplified manner; each selection unit 15 contains a switch, via which optionally either the data distributor line 20 or the respective selection decoder 25 can be connected to the output terminal 16 of the respective selection unit 15.

In FIG. 4, the redundant data line 11 is arranged adjacent to a first, upper group 17 of non-redundant data lines 12. However, the redundant data line 11 is not fixedly assigned to the memory segment 45 represented by the group 17, but rather can be assigned freely to an arbitrary memory segment 45 with the aid of the data distributor line 20. By contrast, no redundant data lines 11 are arranged in direct proximity adjacent to the second, in FIG. 4 lower group 17 of non-redundant data lines 12 of the lower memory segment 45. Nevertheless, the redundant data line 11 that is arranged further away and initially has no unambiguous assignment can be assigned to the lower memory segment 45, to put it more precisely to its defective data line 12c, via the data distributor line 20 and via the selection units 15. For this purpose, the lower selection unit 15 is switched such that the data distributor line 20 is connected to the output terminal 16 within the selection unit 15 instead of the defective data line 12c. This changeover of the internal switch of the lower selection unit 15 is performed at least when in each case precisely the defective data line 12c is being driven and not one of the remaining, still intact non-redundant data lines 12 of the lower memory segment 45. In this way, the defective data line 12c is replaced by the redundant data line 11 by means of the switching of the selection unit 15 and the forwarding of the respective data D via the data distributor line 20 and the redundant data line 11. Consequently, the redundant data line 11, even as arranged alongside the upper memory segment 45, can be assigned to the lower memory segment 45 or any other memory segment 45. The upper selection unit 15 illustrated in FIG. 4, by contrast, is controlled in such a way that it always connects the selection decoder 25 assigned to it to the output terminal 16, so that all the non-redundant data lines 12 of the upper memory segment 45 are still addressed.

The method described with reference to FIG. 4 can be used both for reading out data D from the semiconductor memory and for storing or writing data D in the semiconductor memory. The redundant data lines 11 are usually connected to the sense amplifier to which are connected, in turn, two mutually complementary bit lines leading to a plurality of memory cells. In the method for reading out data from memory cells which are assigned to a redundant data line 11, the data D are forwarded via the redundant data line 11, the turned-on switching element 13, the data distributor line 20 and the respective turned-on selection unit 15 (the lower selection unit 15 in FIG. 4) in the direction of the output of the semiconductor memory 1. On the output side, the read-out data D can be conducted to an output amplifier 21, for example. In the method for writing or storing data D in the semiconductor memory, the data D are received by the semiconductor memory. The external contact terminals can be used both for receiving and for outputting data. Consequently, each output terminal mentioned in this application can simultaneously also serve as an input terminal, that is to say a combined input/output terminal.

When writing in data D, the data D are communicated via the relevant selection unit 15 (the lower selection unit 15 in FIG. 4) and the data distributor line 20 and also the turned-on switching element 13 to the redundant data line 11, from where they are written to one or more redundant memory cells.

As in the rest of the figures, the redundant data lines 11 illustrated as individual lines in FIG. 4, the non-redundant data lines 12 and also the data distributor line 20 and likewise also other lines can, in each case, be formed as a line pair having, in each case, two mutually complementary individual lines in order to communicate the data D or other signals in the form of potential differences.

Embodiments of the present invention enable a particularly versatile and flexible assignment of the redundant data lines provided at a semiconductor memory to arbitrary memory areas.

What is claimed is:

1. An integrated semiconductor memory comprising:
    a plurality of memory segments, each of the plurality of memory segments comprising a set of non-redundant data lines and at least one redundant data line;
    at least one data distributor line;
    a plurality of selection circuits coupled between the at least one redundant data line from the plurality of memory segments and the at least one data distributor line, wherein, with the aid of the selection circuits, a respective redundant data line from each of the plurality of memory segments can be connected to each data distributor line selectively with respect to other redundant data lines; and
    a plurality of selection units, wherein the at least one data distributor line is in each case connected to first input terminals of the selection units.

2. The integrated semiconductor memory of claim 1, wherein, if a first segment of the plurality of memory segments has more defective columns than a number of redundant columns, the memory uses at least one redundant column from another segment from the plurality of memory segments, wherein the at least one redundant column from another segment from the plurality of memory segments is coupled to an output amplifier via the at least one data distributor line and at least one of the plurality of selection circuits.

3. An integrated semiconductor memory comprising:
    a plurality of memory segments, each of the plurality of memory segments comprising a set of non-redundant data lines and at least one redundant data line, wherein the non-redundant data lines and the at least one redundant data line are configured to communicate data read out from memory cells from the plurality of memory segments, wherein the semiconductor memory has at least one data distributor line,
wherein a plurality of redundant data lines comprising the at least one redundant data line from each of the plurality of memory segments is connected up to the at least one data distributor line in such a way that in each case the at least one redundant data line from each of the plurality of segments from the plurality of redundant data lines can be selected and can be connected to the at least one data distributor line,
wherein the redundant data lines are connected up to the at least one data distributor line via switching elements,
wherein, with the aid of the switching elements, a respective redundant data line can be connected to each data distributor line selectively with respect to other redundant data lines, and
wherein the semiconductor memory has a plurality of selection units, wherein the at least one data distributor line is in each case connected to first input terminals of the selection units.

4. The semiconductor memory as claimed in claim 3, wherein the selection units furthermore have output terminals which output data forwarded to the selection units.

5. The semiconductor memory as claimed in claim 4, wherein the selection units furthermore have second input terminals, to which are connected to non-redundant data lines or lines connected downstream of the non-redundant data lines.

6. The semiconductor memory as claimed in claim 5, wherein the selection units enable optionally outputting data received via the first input terminals or of data received via the second input terminals.

7. The semiconductor memory as claimed in claim 4, wherein the output terminals of the selection units are connected to output amplifiers for outputting data from the semiconductor memory.

8. The semiconductor memory as claimed in claim 3, wherein an arbitrary one of the redundant data lines can be connected to an arbitrary one of the plurality of selection units by the at least one data distributor line and the switching elements.

9. The semiconductor memory as claimed in claim 3, wherein each redundant data line and each non-redundant data line is connected to at least one sense amplifier to which two bit lines are connected.

10. The semiconductor memory as claimed in claim 9, wherein each redundant data line and each non-redundant data line is connected to a group of sense amplifiers.

11. The semiconductor memory as claimed in claim 10, wherein each redundant data line and each non-redundant data line is permanently conductively connected to all the sense amplifiers of the respective group of sense amplifiers.

12. The semiconductor memory as claimed in claim 10, wherein the semiconductor memory has at least one group of select lines, wherein a respective sense amplifier from a plurality of groups of sense amplifiers is connected to each select line, and wherein the groups of sense amplifiers are in each case assigned to different redundant data lines and/or non-redundant data lines.

13. The semiconductor memory as claimed in claim 12, wherein with the aid of the select lines it is possible to select which sense amplifier within the groups of sense amplifiers in each case forwards data to the relevant data line connected to the respective group of sense amplifiers.

14. The semiconductor memory as claimed in claim 12, wherein each sense amplifier is connected to in each case two bit lines which serve for reading out from memory cells which are connected to the bit lines and to a group of word lines.

15. The semiconductor memory as claimed in claim 14, wherein at least the memory cells whose data can be read out via non-redundant data lines connected to a common selection decoder are connected to the same group of word lines.

16. The semiconductor memory as claimed in claim 14, wherein the sense amplifiers are in each case arranged in alternating succession at opposite sides of at least one group of word lines.

17. The semiconductor memory as claimed in claim 3, wherein the semiconductor memory has a plurality of selection decoders which are arranged alongside one another and are in each case connected to a group of non-redundant data lines having in each case an identically sized number of non-redundant data lines.

18. The semiconductor memory as claimed in claim 17, wherein the non-redundant data lines which are connected to the plurality of selection decoders run parallel to one another, and wherein in each case one or a plurality of redundant data lines run between mutually adjacent groups of non-redundant data lines.

19. The semiconductor memory as claimed in claim 18, wherein the redundant data lines in each case pass between adjacent groups of non-redundant data lines and end at the switching elements via which they are connected to the at least one data distributor line.

20. The semiconductor memory as claimed in claim 19, wherein sense amplifiers connected to the redundant data lines are connected to same select lines as sense amplifiers connected to the non-redundant data lines of the adjacent groups of non-redundant data lines.

21. The semiconductor memory as claimed in claim 18, wherein in each case precisely one redundant data line or precisely one pair of redundant data lines passes between in each case two mutually adjacent groups of non-redundant data lines that are in each case connected to a dedicated selection decoder.

22. The semiconductor memory as claimed in claim 3, wherein each data line is formed as a pair of two mutually complementary individual lines which together in each case communicate a data value in the form of a potential difference between potentials of the two individual lines.

23. The semiconductor memory as claimed in claim 22, wherein each data distributor line can be connected to an arbitrary output amplifier from a plurality of output amplifiers with the aid of the selection units, wherein in each case a selected selection unit blocks a forwarding of data from a selection decoder connected upstream of it and the rest of the selection units forward data received from the rest of the selection decoders to the rest of the output amplifiers.

24. The semiconductor memory as claimed in claim 23, wherein each redundant data line can be driven in such a way that it can be addressed instead of a non-redundant data line from an arbitrary group of non-redundant data lines which is able to be connected via a selection decoder to the same selection unit as the relevant redundant data line.

25. The semiconductor memory as claimed in claim 3, wherein the switching elements are transistors.

26. The semiconductor memory as claimed in claim 3, wherein the semiconductor memory is a volatile read/write memory.

27. An integrated semiconductor memory comprising:
a plurality of memory segments, each of the plurality of memory segments comprising a set of non-redundant data lines and at least one redundant data line, wherein the non-redundant data lines and the at least one redundant data line are configured to communicate data read out from memory cells from the plurality of memory segments, wherein the semiconductor memory has at least one data distributor line, wherein a plurality of redundant data lines comprising the at least one redundant data line from each of the plurality of memory segments is connected up to the at least one data distributor line in such a way that in each case the at least one redundant data line from each of the plurality of segments from the plurality of redundant data lines can be selected and can be connected to the at least one data distributor line, wherein the redundant data lines are connected up to the at least one data distributor line via switching elements, wherein, with the aid of the switching elements a respective redundant data line can be connected to each data distributor line selectively with respect to other redundant data lines, wherein the semiconductor memory has at least one selection decoder which is connected to a plurality of non-redundant data lines and is controlled in such a way that it forwards data communicated via a non-redundant data line or a group of non-redundant data lines and in the process blocks the forwarding of the data of other non-redundant data lines to which the selection decoder is connected, and wherein the at least one selection decoder is assigned to precisely one output amplifier disposed downstream of the selection decoder.

28. The semiconductor memory as claimed in claim 27, wherein:

the semiconductor memory has a plurality of selection units; and the at least one selection decoder is connected up to the output amplifier assigned thereto via one or a plurality of lines connected downstream and one of the selection units.

29. The semiconductor memory as claimed in claim 28, wherein each selection unit is controlled in such a way that it forwards to the output amplifier optionally data received from the respective selection decoder or data received via the data distributor line.

* * * * *